US010794937B2

(12) United States Patent
Kosuga et al.

(10) Patent No.: US 10,794,937 B2
(45) Date of Patent: Oct. 6, 2020

(54) POWER CONVERSION DEVICE

(71) Applicant: HITACHI AUTOMOTIVE SYSTEMS, LTD., Ibaraki (JP)

(72) Inventors: Masashi Kosuga, Hitachinaka (JP);
Takeshi Kato, Hitachinaka (JP);
Takeshi Tajiri, Hitachinaka (JP);
Hidehiko Takahara, Hitachinaka (JP);
Nobuaki Gorai, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 16/478,467

(22) PCT Filed: Dec. 19, 2017

(86) PCT No.: PCT/JP2017/045438
§ 371 (c)(1),
(2) Date: Jul. 16, 2019

(87) PCT Pub. No.: WO2018/135213
PCT Pub. Date: Jul. 26, 2018

(65) Prior Publication Data
US 2019/0361053 A1  Nov. 28, 2019

(30) Foreign Application Priority Data
Jan. 17, 2017 (JP) .................. 2017-005515

(51) Int. Cl.
*G01R 15/20* (2006.01)
*H02M 7/00* (2006.01)
(Continued)

(52) U.S. Cl.
CPC .......... *G01R 15/207* (2013.01); *H02M 7/003* (2013.01); *H02M 7/48* (2013.01); *H05K 9/0024* (2013.01);
(Continued)

(58) Field of Classification Search
CPC ...... G01R 15/207; H02M 7/003; H02M 7/48; H05K 9/0024; H05K 1/181; H05K 2201/10151; H05K 2201/10371
See application file for complete search history.

(56) References Cited

U.S. PATENT DOCUMENTS

2008/0094060 A1  4/2008  Muraki et al.
2010/0194381 A1*  8/2010  Ito .................. G01R 15/207
                                              324/117 R
(Continued)

FOREIGN PATENT DOCUMENTS

JP    2005-321206 A    11/2005
JP    2008-102116 A     5/2008
(Continued)

OTHER PUBLICATIONS

International Search Report dated Feb. 27, 2018 for the PCT International Application No. PCT/JP2017/045438.

*Primary Examiner* — Jayprakash N Gandhi
*Assistant Examiner* — Hung Q Dang
(74) *Attorney, Agent, or Firm* — Volpe and Koenig, P.C.

(57) ABSTRACT

A power conversion device of the present invention includes a power conversion circuit configured to convert power; a conductor configured to transmit a current to the power conversion circuit; and a coreless current sensor configured to detect the current, in which the coreless current sensor includes: a magnetic field detection portion configured to detect a magnetic field of the current; and a shield portion that faces the magnetic field detection portion, the conductor includes: a first conductor portion that passes through a space between the magnetic field detection portion and the shield portion; and a second conductor portion connected to the first conductor portion via a first bent portion, and the first bent portion is formed such that the space between the magnetic field detection portion and the shield portion is not (Continued)

disposed in a direction perpendicular to a face of the second conductor portion closest to the shield portion.

6 Claims, 4 Drawing Sheets

(51) Int. Cl.
  *H02M 7/48* (2007.01)
  *H05K 9/00* (2006.01)
  *H05K 1/18* (2006.01)
(52) U.S. Cl.
  CPC ... *H05K 1/181* (2013.01); *H05K 2201/10151* (2013.01); *H05K 2201/10371* (2013.01)

(56) References Cited

U.S. PATENT DOCUMENTS

| | | |
|---|---|---|
| 2011/0221430 A1 | 9/2011 | Ito |
| 2014/0049255 A1* | 2/2014 | Kitamoto ............. G01R 15/207 324/244 |

FOREIGN PATENT DOCUMENTS

| | | |
|---|---|---|
| JP | 2010-175474 A | 8/2010 |
| JP | 2011-185788 A | 9/2011 |
| JP | 2015-175757 A | 10/2015 |
| JP | 2016-065791 A | 4/2016 |
| JP | 2016100943 * | 5/2016 .............. H02M 7/48 |

* cited by examiner

POWER CONVERSION DEVICE

TECHNICAL FIELD

The present invention relates to a power conversion device, and more particularly to a power conversion device that supplies power to a vehicle driving motor.

BACKGROUND ART

A power conversion device that supplies power to a vehicle driving motor outputs an alternating current to the motor. A current sensor for detecting this alternating current is used. A bus bar that transmits the alternating current penetrates the current sensor. PTL 1 describes current detection in a case where the bus bar is bent.

While the installation space of the power conversion device is demanded to be as small as possible, the influence of noise on the current sensor is demanded to be reduced.

CITATION LIST

Patent Literature

PTL 1: JP 2015-175757 A

SUMMARY OF INVENTION

Technical Problem

It is therefore an object of the present invention to reduce a current detection error of a current sensor while suppressing the upsizing of a power conversion device equipped with the current sensor.

Solution to Problem

A power conversion device according to the present invention includes a power conversion circuit configured to convert power; a conductor configured to transmit a current to the power conversion circuit; and a coreless current sensor configured to detect the current, in which the coreless current sensor includes: a magnetic field detection portion configured to detect a magnetic field of the current; and a shield portion that faces the magnetic field detection portion, the conductor includes: a first conductor portion that passes through a space between the magnetic field detection portion and the shield portion; and a second conductor portion connected to the first conductor portion via a first bent portion, and the first bent portion is formed such that the space between the magnetic field detection portion and the shield portion is not disposed in a direction perpendicular to a face of the second conductor portion closest to the shield portion.

Advantageous Effects of Invention

According to the present invention, it is possible to reduce the current detection error of the current sensor while suppressing the upsizing of the power conversion device equipped with the current sensor.

DESCRIPTION OF EMBODIMENTS

An embodiment according to the present invention will be described with reference to FIGS. 1 to 5.

Figure 3:
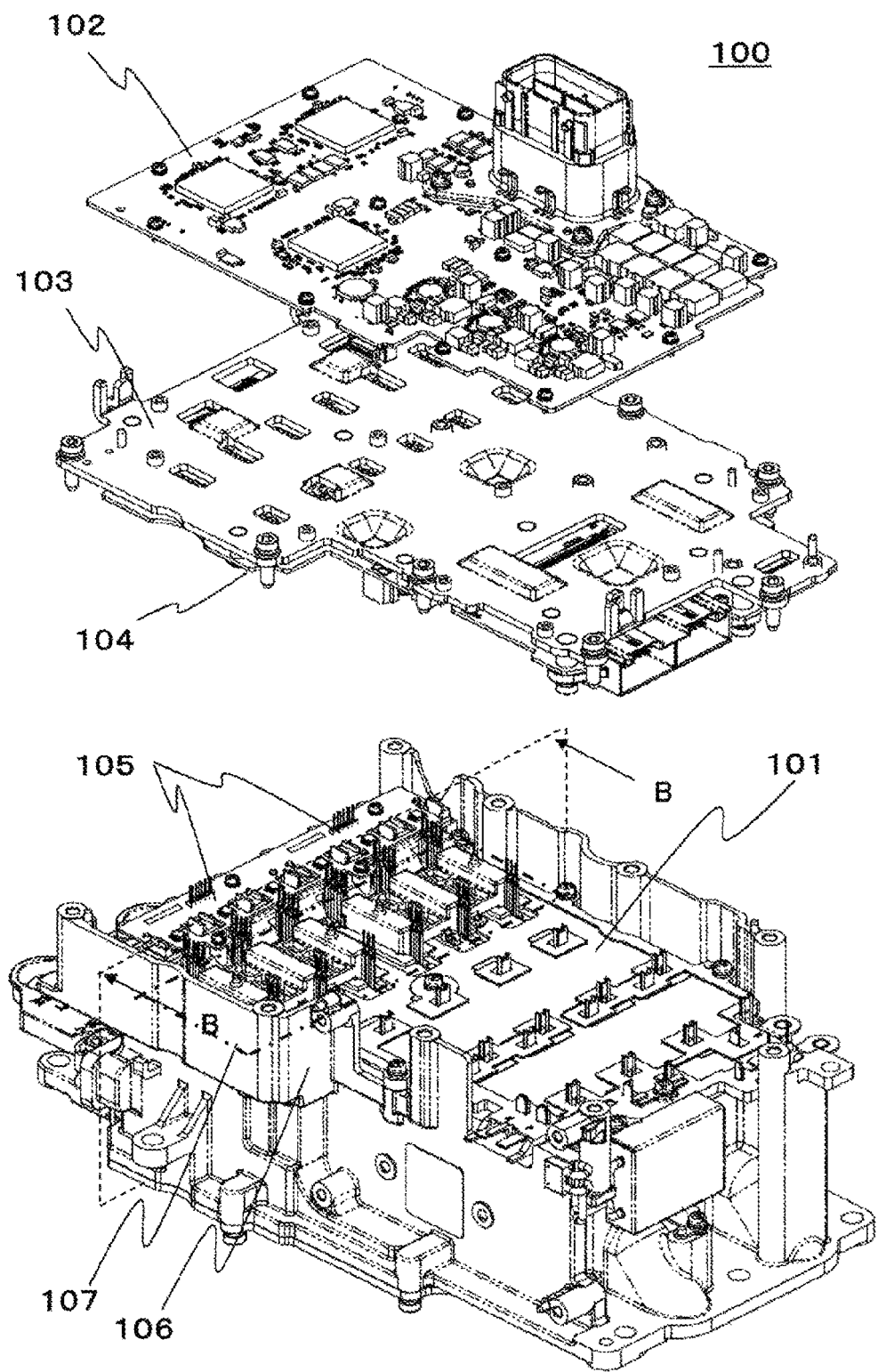
FIG. 3 is an exploded perspective view of the power conversion device 100 according to the present embodiment.

FIG. 3 is an exploded perspective view of a power conversion device 100 according to the present embodiment.

A power semiconductor module 107 has an inverter circuit that converts a direct current into an alternating current.

A mold bus bar 101 electrically connects a smoothing capacitor (not shown) and the power semiconductor module 107. The mold bus bar 101 is composed of a metal bus bar and a molding material for insulating this bus bar. The mold bus bar 101 holds coreless current sensors 105 and is attached to a case 106.

The coreless current sensors 105 are attached to the mold bus bar 101 and disposed between the mold bus bar 101 and a gate driver board 104.

The case 106 holds the mold bus bar 101 and holds a metal base 103.

The gate driver board 104 is attached to the metal base 103 and disposed at a position opposing the mold bus bar 101 with the coreless current sensors 105 interposed therebetween. The gate driver board 104 is also disposed at a position opposing a motor control board 102 with the metal base 103 interposed therebetween.

The metal base 103 is attached to the case 106, holds the motor control board 102 and the gate driver board 104, and is disposed between the gate driver board 104 and the motor control board 102.

Figure 1:
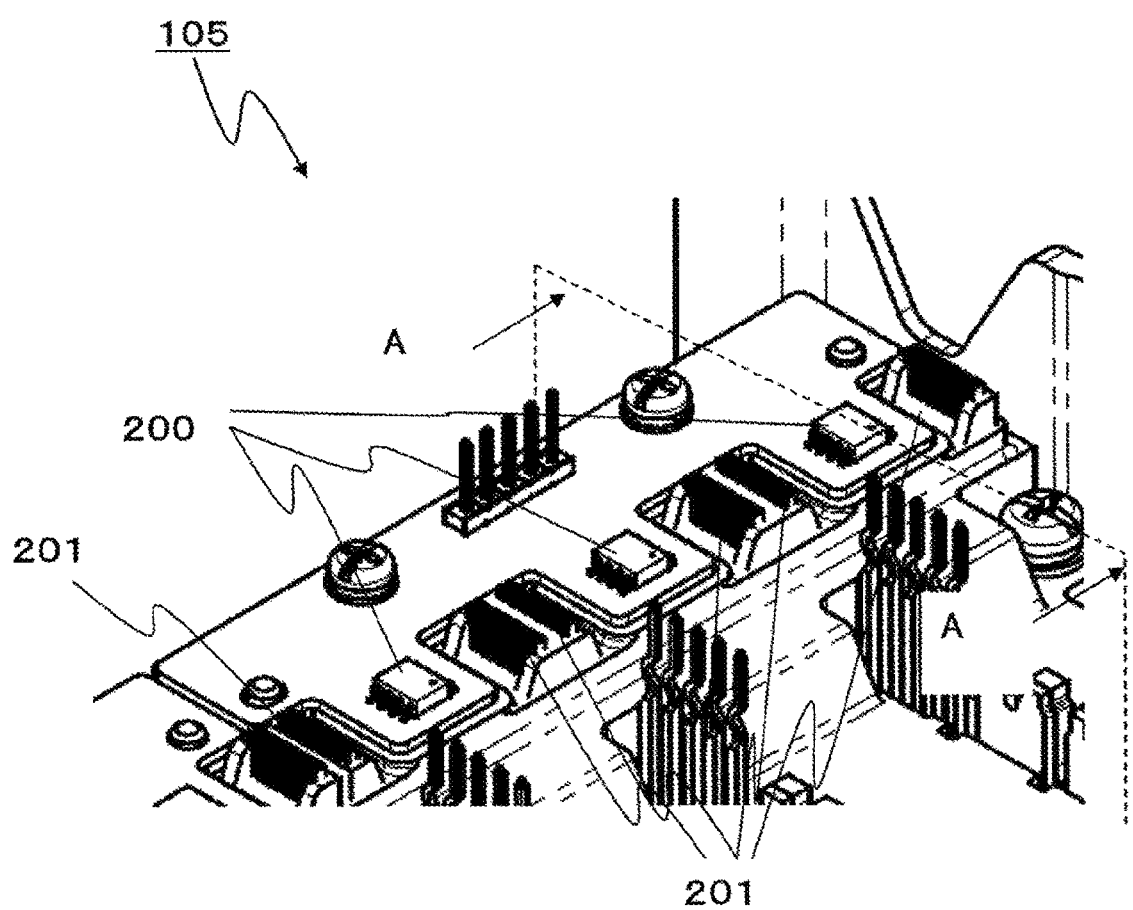
FIG. 1 is an enlarged view of the vicinity of a coreless current sensor 105 in a power conversion device 100.
Figure 2:
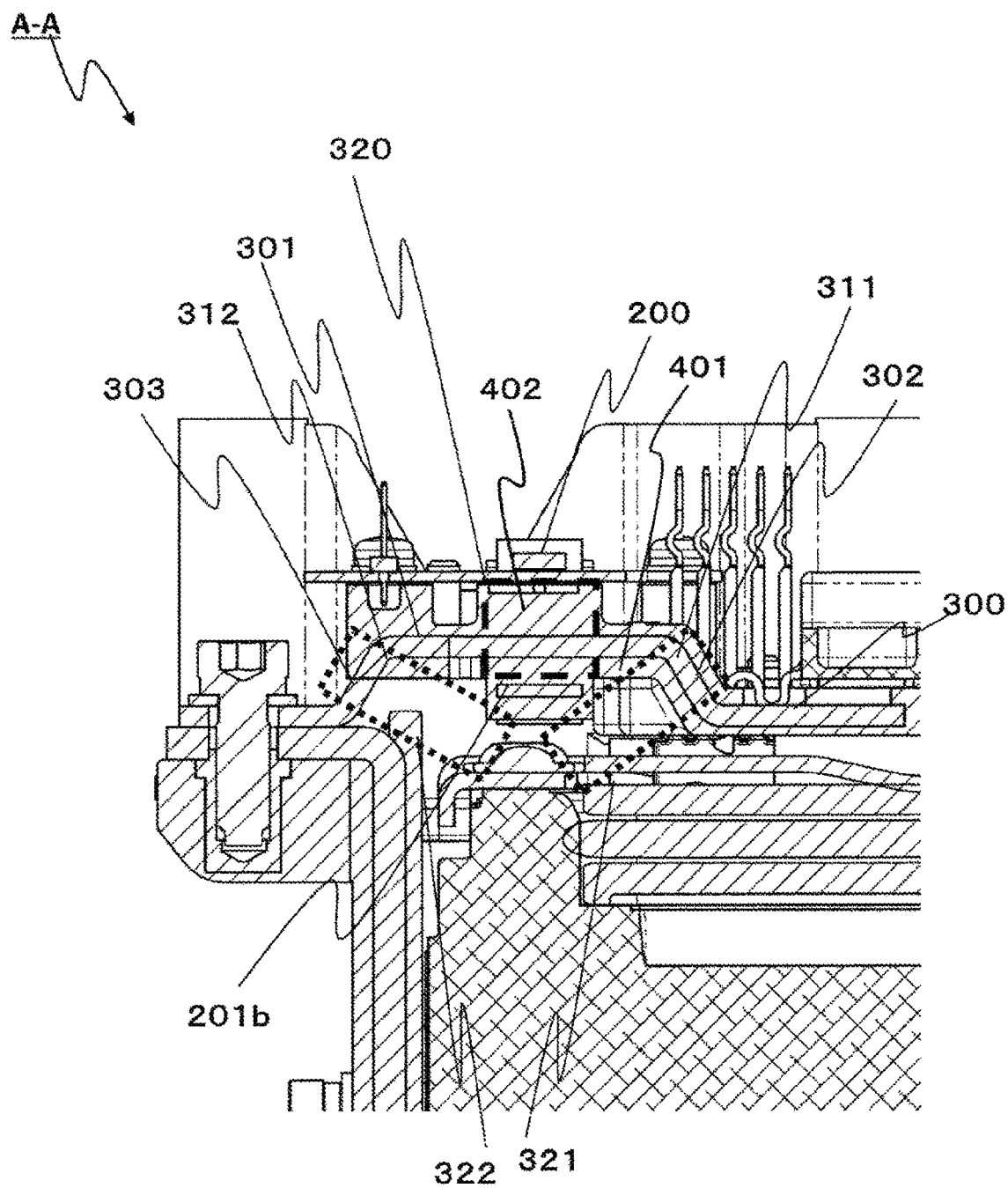
FIG. 2 is a cross-sectional view of the vicinity of the coreless current sensor 105 as viewed from the direction indicated by the arrow of the plane AA in FIG. 1.
Figure 4:
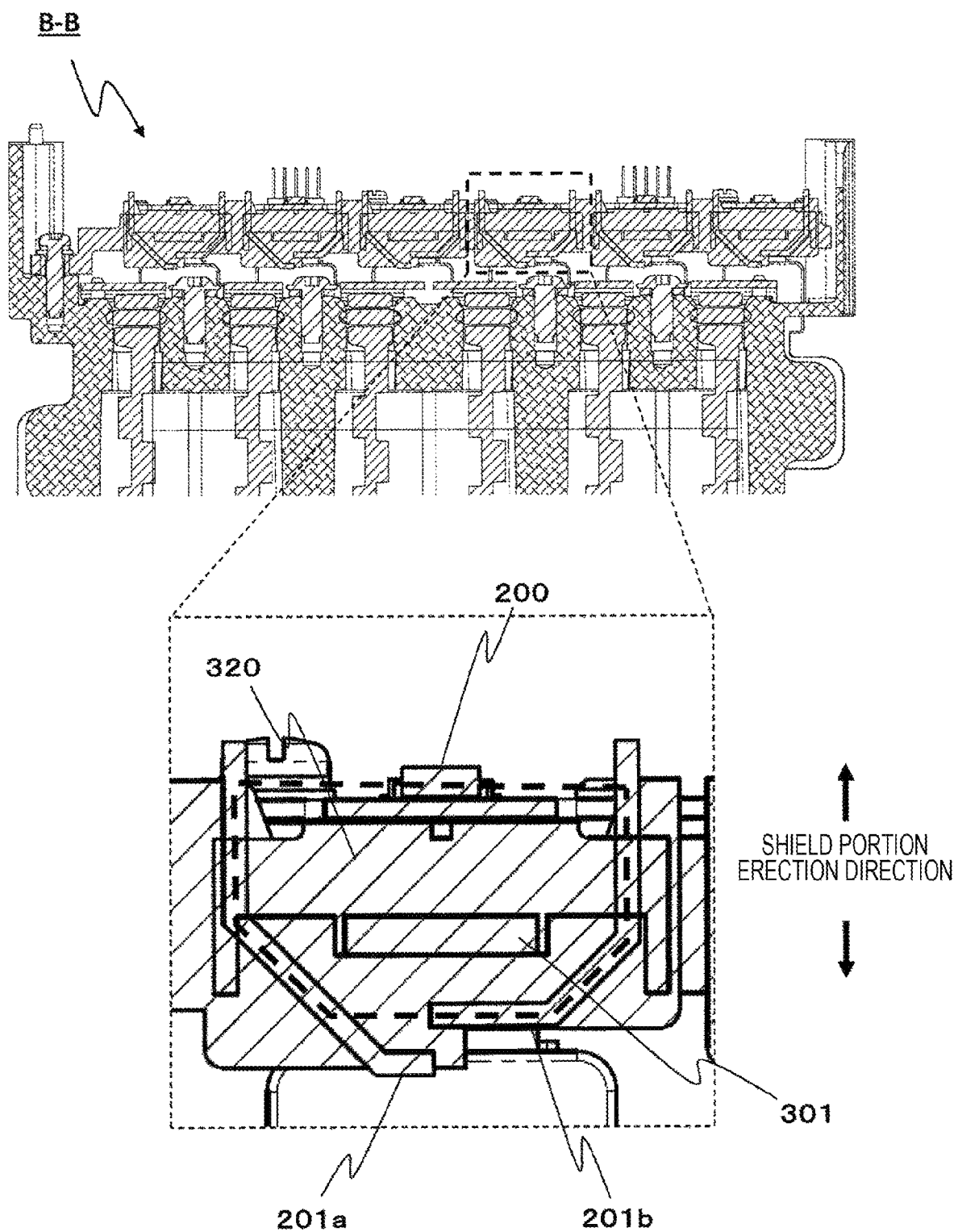
FIG. 4 is a cross-sectional view of the power conversion device 100 as viewed from the direction indicated by the arrow of the plane BB in FIG. 3.

FIG. 1 is an enlarged view of the vicinity of the coreless current sensor 105 in the power conversion device 100. FIG. 2 is a cross-sectional view of the vicinity of the coreless current sensor 105 viewed from the direction indicated by the arrow of the plane AA in FIG. 1. FIG. 4 is a cross-sectional view of the power conversion device 100 as viewed from the direction indicated by the arrow of the plane BB in FIG. 3.

The coreless current sensor 105 is composed of magnetic field detection portions 200 and shield portions 201. As shown in FIG. 4, the shield portion 201 is composed of a first shield portion 201a and a second shield portion 201b.

The magnetic field detection portion 200 is disposed between the two opposing shield portions, the first shield portion 201a and the second shield portion 201b.

A conductor 300 shown in FIG. 2 transmits an alternating current outputted from the power semiconductor module 107.

A first conductor portion 301 is connected to a second conductor portion 302 via a first bent portion 311. A third conductor portion 303 is connected to the first conductor portion 301 via a second bent portion 312.

The first conductor portion 301 is disposed so as to penetrate a space 320 between the magnetic field detection portion 200 and the shield portion 201.

The magnetic field detection portion 200 is disposed at a position opposing the second shield portion 201b with the first conductor portion 301 interposed therebetween.

A region 321 is a region where the magnetic field generated in a direction perpendicular to the main face of the second conductor portion 302 is strong. The second conductor portion 302 is a rectangular bus bar and has a main face larger in area than other faces. In the direction perpendicular to this main face, the generated magnetic field becomes strong.

The first bent portion 311 is formed such that a space 320 is not disposed in a direction perpendicular to the face of the second conductor portion 302 closest to the second shield portion 201b. That is, the first bent portion 311 is formed such that the region 321 is not disposed in the space 320.

Similarly, a region 322 is a region where the magnetic field generated in a direction perpendicular to the main face of the third conductor portion 303 is strong. The third conductor portion 303 is a rectangular bus bar and has a main face larger in area than other faces. In the direction perpendicular to this main face, the generated magnetic field becomes strong.

The second bent portion 312 is formed such that the space 320 is not disposed in a direction perpendicular to the face of the third conductor portion 303 closest to the second shield portion 201b. That is, the second bent portion 312 is formed such that the region 322 is not disposed in the space 320.

Accordingly, it is possible to reduce the influence of the magnetic field generated in the second conductor portion 302 or the third conductor portion 303 and improve the detection accuracy of the magnetic field generated in the first conductor portion 301. Then, since the flexibility of the conductor layout can be enhanced in the vertical direction by the first bent portion 311 or the second bent portion 312 without deteriorating the current detection error of the coreless current sensor 105, the space can be efficiently utilized to expect the downsizing of the product.

Note that the second conductor portion 302 and the third conductor portion 303 are rectangular bus bars in the present embodiment, but may be conductors having a round or elliptical cross section.

As shown in FIG. 4, the end portion of the first shield portion 201a is disposed at a position opposing the first conductor 301 with the end portion of the second shield portion 201b interposed therebetween, and the end portion of the first shield portion 201a and the end portion of the second shield portion 201b are formed so as to have an opening therebetween.

The end portion of the second shield portion 201b is disposed between the end portion of the first shield portion 201a and the first conductor portion 301 and is disposed at a position opposing the magnetic field detection portion 200 with the first conductor portion 301 interposed therebetween.

The first shield portion 201a and the second shield portion 201b form a first shield erecting portion 201c and a second shield erecting portion 201d, respectively, which are formed in a direction parallel to the disposition direction of the magnetic field detection portion 200 and the conductor.

The space 320 between the magnetic field detection portion 200 and the shield portion 201 is formed so as to be surrounded by the end portion and the side of the second shield portion 201b, the side of the first shield portion 201a, and the magnetic field detection portion 200.

By providing the first shield erecting portion 201c and the second shield erecting portion 201d with an angle with respect to the end portion of the first shield portion 201a and the end portion of the second shield portion 201b, it is possible to shorten the distance parallel to the shield erecting direction and suppress the influence of mutual interference even if the distance between the adjacent coreless current sensors 105 is shortened.

Since the adjacent coreless current sensors 105 can be disposed close to each other in a short distance without deteriorating the accuracy of the coreless current sensors 105, it is possible to expect the downsizing of the product.

As shown in FIG. 4, the first shield portion 201a and the first conductor portion 301 are supported by a first insulator 401. Although not shown, the second shield portion 201b is also supported by the first insulator 401.

In particular, the first insulator 401 is disposed so as to be extended to a position supporting the first conductor portion 301 and the first bent portion 311 and is embedded in a second insulator 402. Accordingly, it is also possible to prevent positional misalignment between the first shield portion 201a and the first conductor portion 301. In other words, it is possible to create the parts with high accuracy such that the space between the magnetic field detection portion 200 and the shield portion 201 and the magnetic field generated perpendicularly to the second conductor portion 302 do not overlap, and maintaining the accuracy of the stable coreless current sensors 105 is expected.

REFERENCE SIGNS LIST 100 power conversion device
101 mold bus bar
102 motor control board
103 metal base
104 gate driver board
105 coreless current sensor
106 case
107 power semiconductor module
200 magnetic field detection portion
201 shield portion
201a first shield portion
201b second shield portion
201c first shield erecting portion
201d second shield erecting portion
300 conductor
301 first conductor portion
302 second conductor portion
311 first bent portion
312 second bent portion
320 space
321 region
322 region
401 first insulator
402 second insulator

The invention claimed is:

1. A power conversion device comprising:
a power conversion circuit configured to convert power;
a conductor configured to transmit a current to the power conversion circuit; and
a coreless current sensor configured to detect the current,
wherein the coreless current sensor comprises: a magnetic field detection portion configured to detect a magnetic field of the current; and a shield portion that faces the magnetic field detection portion,
the conductor comprises: a first conductor portion that passes through a space between the magnetic field detection portion and the shield portion; and a second conductor portion connected to the first conductor portion via a first bent portion, and
the first bent portion is formed such that the space between the magnetic field detection portion and the shield portion is not disposed in a direction perpendicular to a face of the second conductor portion closest to the shield portion.

2. The power conversion device according to claim 1, wherein the conductor further comprises a third conductor portion connected to the first conductor portion via a second bent portion disposed on a side opposite to the first bent portion with the first conductor portion interposed therebetween, and the second bent portion is formed such that the space between the magnetic field detection portion and the shield portion is not disposed in a direction perpendicular to a face of the third conductor portion closest to the shield portion.

3. The power conversion device according to claim 1, further comprising: a first insulator that supports the shield portion and the conductor; and a second insulator in which the first insulator is embedded, wherein the first insulator is extended to a position supporting the first conductor portion of the conductor and the first bent portion.

4. The power conversion device according to claim 1, wherein the shield portion surrounds the magnetic field detection portion with a first shield portion and a second shield portion, the second shield portion is formed such that an end portion of the second shield portion is sandwiched between an end portion of the first shield portion and the first conductor portion, and the space between the magnetic field detection portion and the shield portion corresponds to the magnetic field detection portion and the second shield portion.

5. The power conversion device according to claim 1, the second conductor portion is a flat conductor with a rectangular cross section, and the first bent portion is formed such that the space between the magnetic field detection portion and the shield portion is not disposed in a direction perpendicular to a widest face of the second conductor portion.

6. The power conversion device according to claim 1, wherein the second conductor portion has a substantially circular or elliptical cross section.

* * * * *